(12) United States Patent
Kim et al.

(10) Patent No.: US 11,450,935 B2
(45) Date of Patent: Sep. 20, 2022

(54) TUNABLE RADIO FREQUENCY CIRCUIT, CONTROL METHOD AND ELECTRONIC DEVICE INCLUDING THE SAME

(71) Applicant: Samsung Electronics Co., Ltd., Gyeonggi-do (KR)

(72) Inventors: Jonghyuk Kim, Gyeonggi-do (KR); Hyoseok Na, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 157 days.

(21) Appl. No.: 16/733,473

(22) Filed: Jan. 3, 2020

(65) Prior Publication Data

US 2020/0220242 A1    Jul. 9, 2020

(30) Foreign Application Priority Data

Jan. 3, 2019 (KR) .................. 10-2019-0000847

(51) Int. Cl.

| | | |
|---|---|---|
| *H01P 1/203* | (2006.01) | |
| *H01P 1/213* | (2006.01) | |
| *H01P 1/212* | (2006.01) | |
| *H03H 7/38* | (2006.01) | |
| *H03H 7/01* | (2006.01) | |

(52) U.S. Cl.
CPC ............. *H01P 1/203* (2013.01); *H01P 1/212* (2013.01); *H01P 1/2135* (2013.01); *H03H 7/0115* (2013.01); *H03H 7/38* (2013.01)

(58) Field of Classification Search
CPC ......... H01P 1/203; H01P 1/212; H01P 1/2135
USPC ................................................. 333/174, 175
See application file for complete search history.

(56) References Cited

U.S. PATENT DOCUMENTS

| | | |
|---|---|---|
| 5,834,975 A | 11/1998 | Bartlett et al. |
| 7,508,285 B2 | 3/2009 | Kokubo |
| 7,720,443 B2 | 5/2010 | Toncich et al. |
| 8,385,483 B2 | 2/2013 | Abdelmonem et al. |
| 9,042,502 B2 | 5/2015 | Malaga et al. |
| 2006/0098723 A1 | 5/2006 | Toncich et al. |
| 2010/0118921 A1 | 5/2010 | Abdelmonem et al. |

(Continued)

FOREIGN PATENT DOCUMENTS

KR    10-1640400 B1    7/2016

OTHER PUBLICATIONS

International Search Report dated Apr. 24, 2020.
European Search Report dated Oct. 28, 2021.

*Primary Examiner* — Rakesh B Patel
(74) *Attorney, Agent, or Firm* — Cha & Reiter, LLC

(57) ABSTRACT

An embodiment of the disclosure provides a tunable radio frequency (RF) circuit, a control method, and an electronic device including the same. An electronic device according to an embodiment of the disclosure may include an antenna, a transceiver, a tunable radio frequency (RF), and at least one processor operatively coupled with the transceiver and the tunable RF circuit. The tunable RF circuit may further include a switch, a low noise amplifier (LNA), a power amplifier (PA), a fixed filter configured to pass signals in a first frequency band, and attenuate signals in a second frequency band at least one tunable filter configured to pass signals in at least a portion of the second frequency band, where the portion of the second frequency band is tunable, and at least one detector configured to detect a signal strength passing through the at least one tunable filter.

17 Claims, 10 Drawing Sheets

(56) References Cited

U.S. PATENT DOCUMENTS

2016/0301383 A1\* 10/2016 Tani ................. H03H 9/568
2018/0048345 A1\* 2/2018 Pehlke ............... H04B 1/40

\* cited by examiner

TUNABLE RADIO FREQUENCY CIRCUIT, CONTROL METHOD AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2019-0000847, filed on Jan. 3, 2019, in the Korean Intellectual Property Office, the disclosure of which is incorporated by reference herein in its entirety.

BACKGROUND

1. Field

One or more embodiments of the instant disclosure generally relate to a tunable radio frequency circuit, a control method for controlling the tunable radio frequency circuit, and an electronic device including the same.

2. Description of Related Art

To satisfy wireless data traffic demand which has grown after the rollout of 4th generation (4G) communication systems, development of advanced 5th generation (5G) communication systems or pre-5G communication systems has advanced. For this reason, 5G or pre-5G communication systems may be referred to as the beyond 4G network communication system or the post long-term-evolution (LTE) system.

To achieve high data rates, the 5G communication system may employ not only bands below 6 GHz but also extremely high frequencies in the mmWave band, such as above 60 GHz band. To mitigate propagation path loss and to extend the propagation distance in the mmWave band, developers of 5G have considered various techniques such as beam-forming, massive multiple input multiple output (MIMO), full dimensional (FD)-MIMO, using an array antenna, analog beam-forming, using large scale antenna techniques, etc.

Conventional radio frequency (RF) circuits filter to transmit or receive only RF signals in a designated band. However, in upcoming 5G systems, RF circuits are needed to operate in various different frequency bands. To do so, they must be able to adequately tune their transceiving frequency based on the actual operational situation.

But as explained above, conventional RF circuits employ fixed filters, and thus may not be able to tune to different frequencies. Further, because the filters are fixed, the RF circuits need to be designed with a sufficient margin for attenuation for their initial design conditions. Accordingly, the performance of the circuits may be compromised, in that only one designated frequency band may be passed by the circuits, causing the circuits to fail to adequately cope with the actual operational situation.

The filter (e.g., band pass filter (BPF)) used in the RF circuit needs to be designed to achieve trade-offs between insertion loss (IL) of the pass frequency band and attenuation of the stop frequency band and to adequately tune the IL or the attenuation in accordance with the actual operational situation.

SUMMARY

An embodiment of the instant disclosure may provide a radio frequency (RF) circuit structure whose filter may be tuned depending on the operational situation, a control method for controlling an RF circuit in the RF circuit structure, and an electronic device including the RF circuit.

A tunable radio frequency (RF) circuit according to an embodiment of the instant disclosure may include a fixed filter or a duplexer for filtering an input signal based on fixed frequency characteristics, at least one tunable filter for filtering the input signal based on tunable frequency characteristics, at least one detector for detecting a signal strength passing through the at least one tunable filter, and a processor for determining a frequency band to be filtered out by the at least one tunable filter based on the signal strength detected at the at least one detector and tuning the at least one tunable filter. The frequency band to be filtered out by the at least one tunable filter may be the determined frequency band.

An electronic device according to an embodiment of the disclosure may include a tunable RF circuit, a transceiver operatively coupled with the tunable RF circuit, and at least one processor operatively coupled with the transceiver and the tunable RF circuit. The at least one processor may be configured to, in lieu of a processor embedded in the tunable RF circuit, determine a frequency band to be filtered out by at least one tunable filter embedded in the tunable RF circuit based on a signal strength detected by at least one detector embedded in the tunable RF circuit, and tune the at least one tunable filter embedded in the tunable RF circuit filters out the determined frequency band.

An electronic device according to an embodiment of the disclosure may include an antenna, a transceiver for transmitting and/or receiving a signal via the antenna, a tunable radio frequency (RF) circuit for tuning a signal strength of a frequency band of the signal between the antenna and the transceiver, and at least one processor operatively coupled with the transceiver and the tunable RF circuit. The tunable RF circuit includes a switch configured to switch the transmitting and the receiving of the signal, a low noise amplifier (LNA) configured to amplify the signal in a reception path for receiving the signal from the switch to the transceiver, a power amplifier (PA) configured to determine a strength of the signal in a transmission path for transmitting the signal from the transceiver to the switch, a fixed filter disposed in a signal line connecting the switch and the antenna, configured to pass signals in a first frequency band, and attenuate signals in a second frequency band, at least one tunable filter divided from the signal line and configured to pass signals in at least a portion of the second frequency band, wherein the portion of the second frequency band is tunable, and at least one detector configured to detect a signal strength passing through the at least one tunable filter.

An electronic device according to an embodiment of the disclosure may include an antenna, a transceiver for transmitting and/or receiving a signal via the antenna, a tunable radio frequency (RF) circuit for tuning frequency band characteristics of the signal between the antenna and the transceiver, and at least one processor operatively coupled with the transceiver and the tunable RF circuit. The tunable RF circuit includes a duplexer including a first fixed filter which passes signals in a first frequency band and attenuating signals in a second frequency band in a transmit signal transmitted from the transceiver to the antenna, and a second fixed filter which passes signals in a third frequency band and attenuating signals in a fourth frequency band in a receive signal transmitted from the antenna to the transceiver, at least one first tunable filter configured to pass signals in at least a portion of the second frequency band of the transmit signal, and tune the portion of the second frequency band, at least one second tunable filter configured to pass signals in at least a portion of the fourth frequency band of the receive signal, and tune the portion of the fourth frequency band, a low noise amplifier (LNA) configured to amplify the receive signal, a power amplifier (PA) configured to determine a power of the transmit signal, at least one first detector configured to detect a first signal strength passing through the at least one first tunable filter, and at least one second detector configured to detect a second signal strength passing through the at least one second tunable filter.

A method for operating an electronic device according to an embodiment of the disclosure may include detecting a signal strength of at least one frequency band filtered out by a tunable filter, determining a frequency band to be filtered out by the tunable filter based on the detected signal strength of the at least one frequency band, and tuning the tunable filter to filter out the determined frequency band.

A method for operating an electronic device according to an embodiment of the disclosure may include detecting a signal strength of at least one frequency band passed by a tunable filter, determining a frequency band to be passed by the tunable filter based on the detected signal strength of the at least one frequency band, and tuning the tunable filter to pass the determined frequency band.

Other aspects, advantages, and salient features of the disclosure will become apparent to those skilled in the art from the following detailed description, which, taken in conjunction with the annexed drawings, discloses an embodiment of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components and structures.

DETAILED DESCRIPTION

Figure 1:
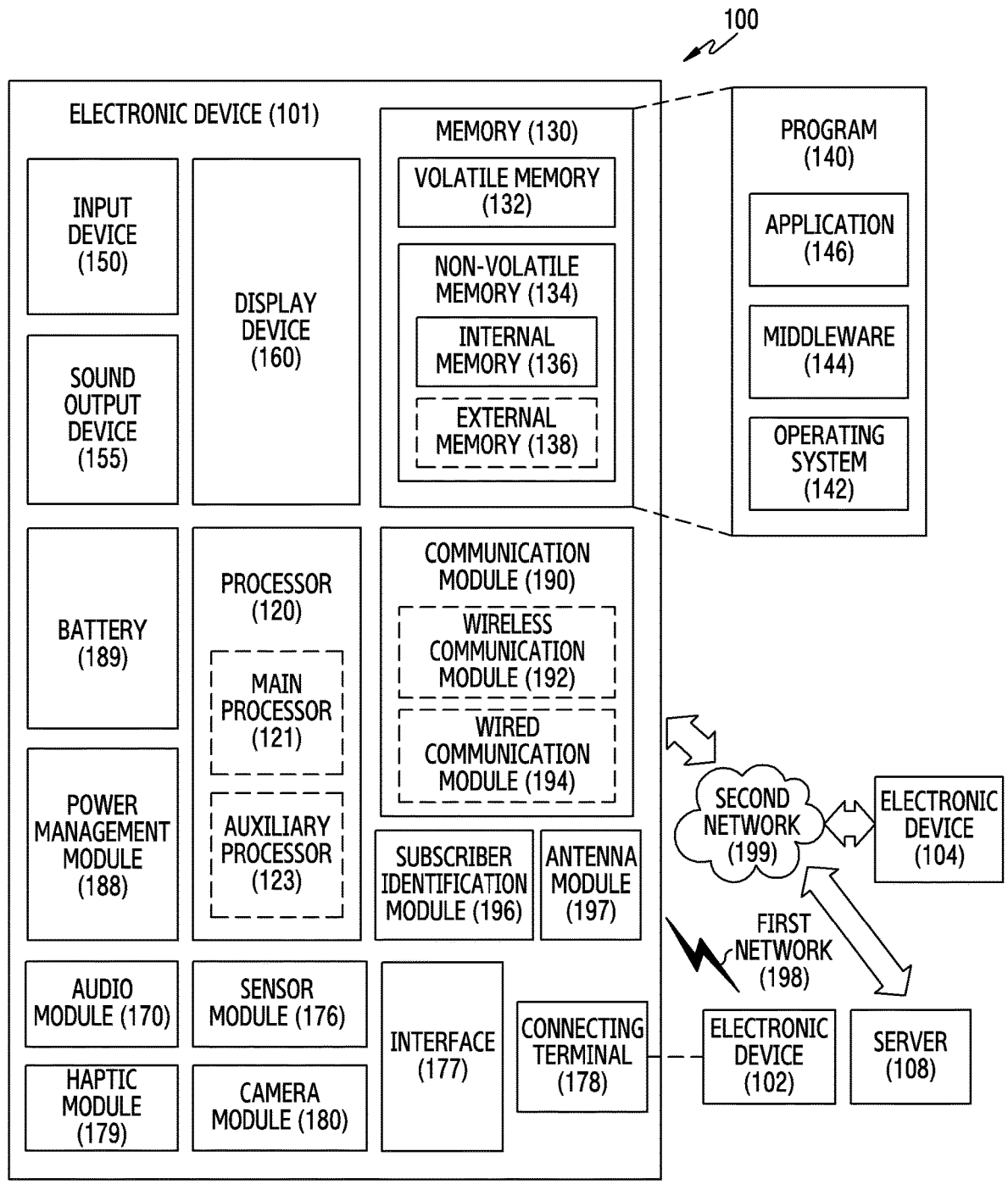
FIG. 1 illustrates a block diagram of an electronic device in a network environment according to an embodiment of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, and without limitation, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
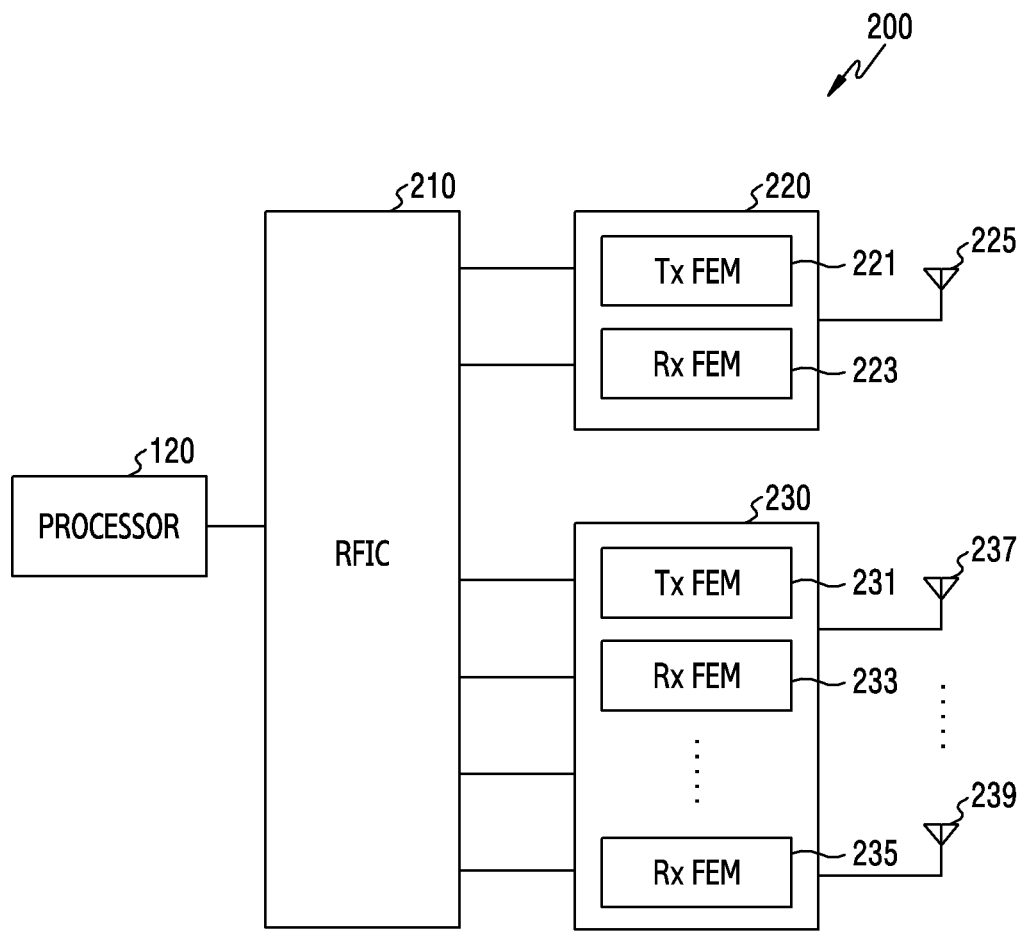
FIG. 2 illustrates a simplified block diagram of a communication circuit of an electronic device according to an embodiment of the disclosure.

FIG. 2 illustrates a simplified block diagram 200 of a communication circuit of an electronic device 101 according to an embodiment of the disclosure.

The communication circuit of the electronic device 101 according to an embodiment may include a processor 120, an RFIC 210, and at least one or more front end modules 220 and 230. For example, the processor 120 may be a modem for processing a communication signal. The FEMs 220 and 230 may be referred to as RF circuits, may transmit or receive a signal by connecting an antenna and the RFIC 210 of the electronic device 101, and may include switches or filters. For example, the FEMs 220 and 230 may include Rx FEMs 223, 233, and 235 for filtering or amplifying the received signal and Tx FEMs 221 and 231 for filtering or amplifying the signal to be transmitted (hereinafter may be referred to as "transmit signal"). For example, the FEMs 220 and 230 may include a FEM 220 for supporting legacy communication networks such as 2G, 3G, and long term evolution (LTE), and a FEM 230 for supporting 5G communication network. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the FEM 220 for supporting the legacy communication includes, but is not limited to, the single Tx FEM 221 and the single Rx FEM 223 in FIG. 2. The FEM 220 may include a plurality of Tx FEMs 221 and/or a plurality of Rx FEMs 223 and may be connected to a plurality of antennas.

According to an embodiment, the FEM 230 for supporting the 5G communication network includes, but is not limited to, the single Tx FEM 231 and the Rx FEMs 233 and 235 in FIG. 2. The FEM 230 may include one Tx FEM and one Rx FEM per antenna.

According to an embodiment, while the electronic device 101 includes, but is not limited to, both of the FEM 220 for supporting the legacy communication and the FEM 230 for supporting the 5G communication network as shown in FIG. 2, in other embodiments the electronic device 101 may include either the FEM 220 or the FEM 230. In another embodiment, the electronic device 101 may include the FEM 220 for supporting a plurality of legacy communications and/or one or more FEMs for supporting a plurality of 5G networks.

According to an embodiment, the RFIC 210 may receive a baseband signal from the processor 120, and up-convert the frequency of the received baseband signal to an RF band signal or down-convert an RF band signal received via the FEMs 220 and 230 to the baseband signal.

According to an embodiment, the communication circuit 200 may include an intermediate integrated circuit (IFIC), which is not shown, at the front end of the RFIC 210. According to an embodiment, the IFIC may receive the baseband signal from the processor 120 (or the modem), and up-convert the frequency of the received baseband signal to an intermediate frequency band. The signal up-converted to the intermediate frequency band may be referred to as an IF signal. According to an embodiment, the IFIC may receive an IF signal of the intermediate frequency band from the RFIC 210, and down-convert the frequency band of the received IF signal to the baseband frequency.

According to this other embodiment, the RFIC 210 may receive the IF signal of the intermediate frequency band from the IFIC, and up-convert the frequency band of the received IF signal to the RF band. Alternatively, the RFIC 210 may receive the baseband signal from the processor 120 or the modem, and up-convert the received baseband signal to the RF band. The signal up-converted to the RF band may be referred to as an RF signal. The RF signal may be transmitted to an external electronic device (e.g., the electronic device 102) via the Tx FEMs 221 and 231 and the antenna. According to different embodiments, the RFIC 210 may receive an RF signal via at least one antenna and the Rx FEMs 223, 233, and 235, and down-convert the frequency band of the received RF signal to the intermediate frequency band or the baseband signal.

According to embodiments, the RFIC 210 may be a component separate from the FEM 220 and 230, or may be integrated with the FEMs 220 and 230. For example, a first RFIC may be integrated with the first FEM 220, and a second RFIC may be integrated with the second FEM 230. In this case, the second RFIC may down-convert RF signals received via the antenna connected to the second FEM 230 to the IF signal of the intermediate frequency band or to the baseband signal.

According to an embodiment, the FEMs 220 and 230 may receive radio signals from the external electronic device (e.g., the electronic device 102 or a base station) via the connected antenna, and forward the received radio signal to the RFIC 210. According to an embodiment, the FEMs 220 and 230 may be disposed on a PCB separate from the PCB on which the processor 120 and/or the RFIC 210 are disposed. According to an embodiment, the FEMs 220 and 230 may be connected to the RFIC 210 via a connecting member. The connecting member may be a flexible PCB (FPCB) or a coaxial cable.

According to an embodiment, the antennas may radiate the RF signal received from at least one of the Tx FEMs 221 and 231 as electromagnetic waves. The antennas may receive an RF signal, when it is electromagnetic wave, from the external electronic device, and forward the received RF signal to the RFIC 210 via at least one of the Rx FEMs 223, 233, and 235.

According to an embodiment, the FEMs 220 and 230 may switch between transmission and reception paths of the signals. For example, in a time division duplex (TDD)-based communication network, the FEMs 220 and 230 may switch the transmission and the reception path by controlling a switch of the FEMs 220 and 230. By controlling the switch, the FEMs 220 and 230 may connect the antennas with a transmission path via the Tx FEMs 221 and 231. The antennas 225, 237, and 239 may receive a transmit signal from the RFIC 210 along the transmission path, and radiate the received transmit signal as electromagnetic waves. Alternatively, by controlling the switch, the FEMs 220 and 230 may connect the antennas 225, 237, and 239 to a reception path via the Rx FEMs 223, 233, and 235. The signal received over the antennas 225, 237, and 239 may be forwarded to the RFIC 210 along the connected reception path. Since the transmission and the reception of the signal are switched by controlling the switch and the transmission and the reception use the same frequency band in the TDD-based communication network, transmit and receive radio channels of the electronic device 101 may have the same characteristics.

According to an embodiment, the FEMs 220 and 230 may transmit signals and receive signals at the same time. For example, in a frequency division duplex (FDD)-based communication network, the transmit signal and the received signal may be separated by means of a duplexer between the FEMs 220 and 230 and the antennas 225, 237, and 239, the signal received over the antennas 225, 237, and 239 may be forwarded to the reception path via the duplexer and the Rx FEMs 223, 233, and 235, and concurrently the transmit signal from the RFIC 210 may be radiated by the antennas 225, 237, and 239 via the Tx FEMs 221 and 231 and the duplexer. Since the frequency band for the transmit signal and the frequency band for the received signal are different in the FDD-based communication network, the transmit and receive radio channel characteristics may be different.

Figure 3:
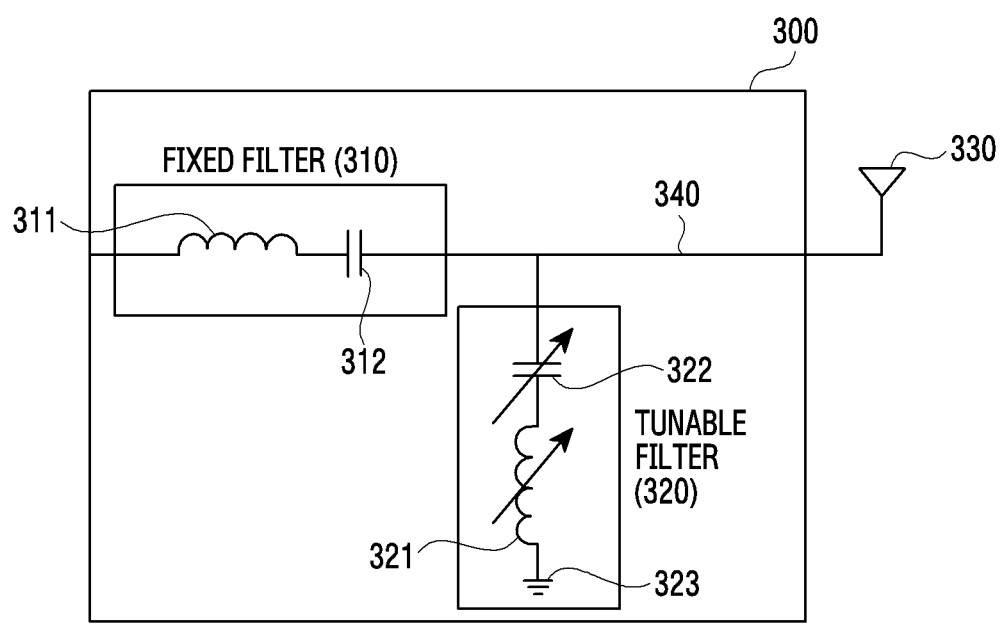
FIG. 3 illustrates a diagram of equivalent circuits of a fixed filter and a tunable filter according to an embodiment of the disclosure.

FIG. 3 illustrates a diagram of equivalent circuits 300 of a fixed filter 310 and a tunable filter 320 according to an embodiment.

Referring to FIG. 3, the fixed filter 310 may be formed with a band pass filter (BPF) including an inductor 311 and/or a capacitor 312 in series. While one end of the fixed filter 310 may be connected to a transceiver and other end may be connected to an antenna 330, an amplifier may be disposed between the one end of the fixed filter 310 and the transceiver. The equivalent circuits 300 of FIG. 3 may be constructed with components using ceramics, PCB, or surface acoustic wave (SAW) technology. Since the fixed filter 310 has a fixed inductor value L and/or capacitor value C, its resonant frequency is also fixed and thus filter characteristics are defined. According to an embodiment, the fixed filter 310 may pass signals of a frequency band (pass band) near the resonant frequency ($f=1/2\pi\sqrt{LC}$) and may attenuate and reject signals outside the pass band. The tunable filter 320 may include a variable inductor 321 and/or a variable capacitor 322. One end of the tunable filter 320 may be connected to the end of the fixed filter 310 that is connected to the antenna 330, and the other end of the tunable filter 320 may be connected to ground 323. Thus, the variable inductor 321 and/or the variable capacitor 322 of the tunable filter 320 may be connected in parallel to a signal line 340 connecting the fixed filter 310 and the antenna 330. Thus, the tunable filter 320 may operate as, for example, a band stop filter (BSF) connected by dividing from the signal line 340. For example, since signals in the pass band of the tunable filter 320 passes through the tunable filter 320 and is forwarded to the ground 323, it may be rejected at the signal line 340 and may not be transmitted to the antenna 330.

Figure 4:
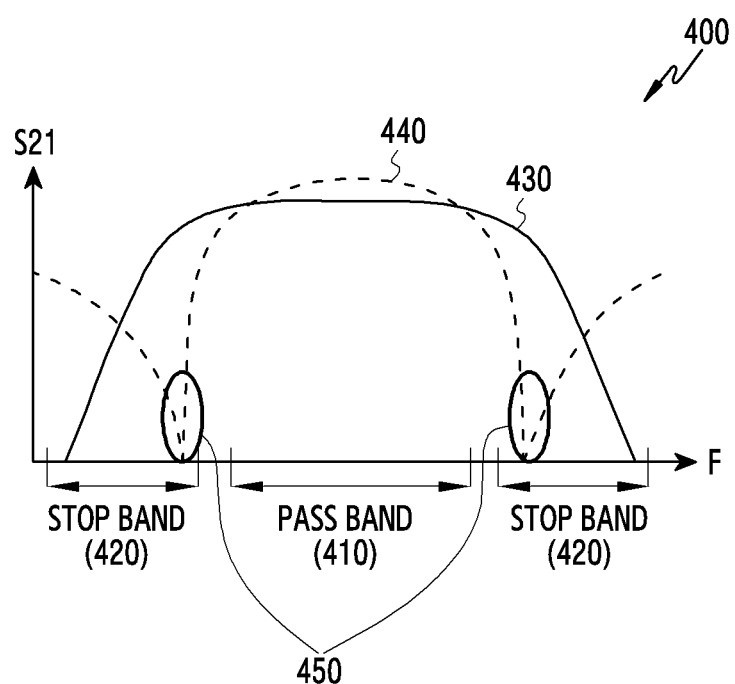
FIG. 4 illustrates a diagram of frequency characteristics of a fixed filter and a tunable filter according to an embodiment of the disclosure.

FIG. 4 illustrates a diagram 400 of frequency characteristics 430 and 440 of a fixed filter 310 and a tunable filter 320 according to an embodiment.

Referring to FIG. 4, the fixed filter 310 may pass signals in the pass band 410 and may attenuate or reject signals in the stop band 420. Depending on the desired signal strengths in the pass band 410 and the stop band 420, the values of the inductor and/or capacitor of the fixed filter 310 may be determined. As its name implies, the frequency characteristics 430 of the fixed filter 310 may not be changed. The tunable filter 320 may change the frequency characteristics 440 by changing the values of the variable inductor 321 and/or the variable capacitor 322, and thus attenuate signals in the stop band 420 at the signal line 340. The frequency characteristics 440 of the tunable filter 320 of FIG. 4 may be exhibited at the signal line 340 which connects the fixed filter 310 and the antenna, and the tunable filter 320 may be referred to as a BPF which passes signals in the frequency band 450. In so doing, there may be included a plurality of fixed filters and a plurality of tunable filters to allow a plurality of pass band and stop bands. As shown in FIG. 3, the tunable filter 320 is divided and connected in parallel between the antenna 330 and the fixed filter 310. Hence, the signal of the stop band 420 may be attenuated through the tunable filter 320, and most of the signal of the pass band 410 may be forwarded to the antenna without passing through the tunable filter 320.

For example, unlike the embodiment of FIG. 3, a plurality of inductors and capacitors may be included in one tunable filter 320, and the number of the inductors and/or the capacitors may be determined based on the attenuation level of the stop band. The attenuation level of the stop band 420 may be determined by varying the number of the inductors and/or the capacitors. Notably, the tunable filter 320, which passes some of the signals in the pass band 410, may be subject to an insertion loss. Accordingly, if the filter is tuned to increase the attenuation of the stop band 420 by, for example, increasing the number of inductors and/or capacitors, the signal attenuation of the pass band 410 also increases and thus the insertion loss increases. Thus, the insertion loss of the pass band 410 and the attenuation of the stop band may have a trade-off relationship.

According to an embodiment, if the LTE communication system operating in B3 (1710 MHz~1880 MHz) band of LTE and the 5G communication system operating in n77 (3300 MHz~4200 MHz) are operational simultaneously, a Tx signal of the B3 frequency band transmitted from a base station of the LTE communication system may be discarded in the reception path of the electronic device while it is operating as the 5G communication system. In so doing, the strength of the discarded signal may correspond to about 10-18 dBm. For example, the Tx signal of the B3 frequency band transmitted from the base station of the LTE communication system may be discarded by a Low Noise Amplifier (LNA) on the reception path of the electronic device operating as the 5G communication system, and 2nd harmonic may occur due to nonlinear characteristics of the LNA. For example, the 2nd harmonic of the Tx signal of the B3 frequency band may be generated at nonlinear elements such as a Power Amplifier (PA) on the TX path from the base station of the LTE communication system, and the generated 2nd harmonic signal may need to be discarded in the reception path of the electronic device operating as the 5G communication system. This is because the 2nd harmonic frequency is the same frequency as the reception frequency of the electronic device operating as the 5G communication system, and thus sensitivity of the received signal may be degraded. To address this problem, the electronic device operating as the 5G communication system may reinforce the attenuation of the discarded Tx signal of the B3 frequency band. However, the filter used in the n77 frequency band may not achieve sufficient attenuation using technology that lacks Q value, such as ceramic or integrated passive device (IPD), rather than SAW or film bulk acoustic resonator (FBAR). And even if proper attenuation is achieved, the trade-off described above may cause the insertion loss.

For example, if operating together with 5G WiFi, the 5G communication system exhibits higher Tx power and Peak-to-Average Power Ratio (PAPR) than the existing LTE and thus may cause greater sensitivity degradation than WiFi equipment. In addition, if various frequencies concurrently operate in the RF structure of the 5G communication system and the filter is designed by considering the attenuation of every frequency, the insertion loss may be degraded more than the existing LTE.

Now, a tunable RF circuit or an FEM for minimizing the insertion loss of the pass band 410 and achieving sufficient attenuation of the stop band 420 by use of the fixed filter 310 and the tunable filter 320 shall be described according to an embodiment of the disclosure.

Figure 5:
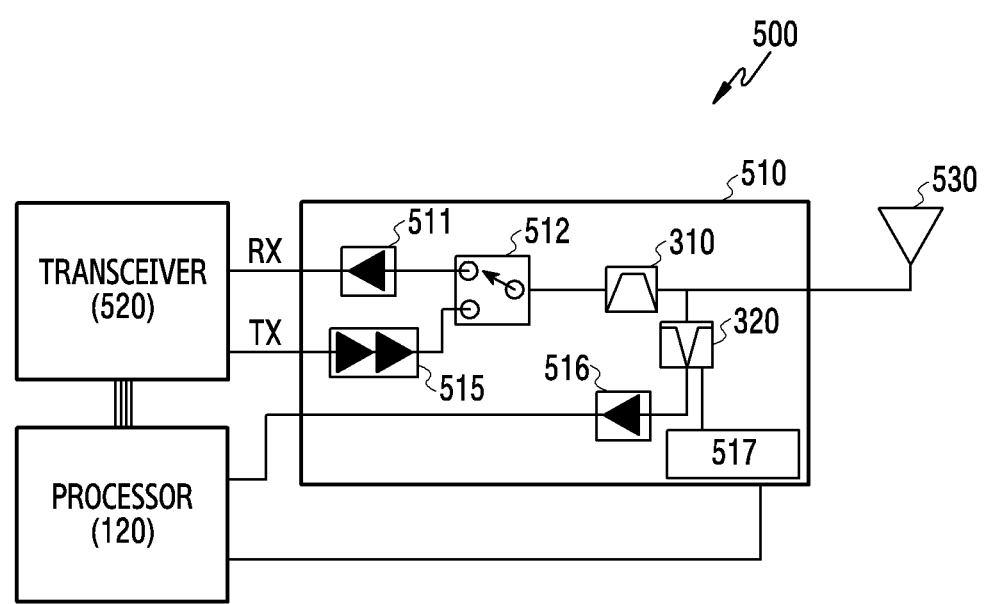
FIG. 5 illustrates a block diagram of a tunable radio frequency (RF) circuit for time division duplex (TDD) according to an embodiment of the disclosure.

FIG. 5 illustrates a block diagram 500 of a tunable RF circuit for TDD according to an embodiment.

Referring to FIG. 5, a tunable RF circuit 510 for TDD according to an embodiment may be connected to an antenna 530, a transceiver 520, and a processor 120. According to other embodiments, the antenna 530 may be included in the tunable RF circuit 510. The transceiver 520 may include an RFIC 210 and/or an IFIC (not shown). The processor 120 may be a general-purpose processor, an application-specific integrated circuit (ASIC), or a modem, for processing communication protocol. The tunable RF circuit 510 for TDD according to an embodiment may include a low noise amplifier (LNA) 511 for amplifying a received signal in a reception path, a power amplifier (PA) 515 for determining power of a transmit signal in a transmission path, a switch 512 for switching the transmission and the reception paths for the signals, a detector 516 for detecting an output signal strength of a fixed filter 310 and/or the tunable filter 320, which are used for filtering the transmit signal and the received signal, and a controller 517 for controlling the pass band and the attenuation level of the tunable filter 320. The controller 517 may also tune the transmit signal strength by controlling the PA 515. According to an embodiment, if the processor 120 functions as the controller 517, the controller 517 may be omitted.

According to an embodiment, the transmit signal or the received signal may be filtered by a combination of the fixed filter 310 and/or the tunable filter 320 as shown in FIG. 3 and FIG. 4. The fixed filter 310 may be designed to pass signals of a determined frequency band (the pass band 410) and to attenuate signals of other frequency bands (the stop band). The tunable filter 320 which is divided from the signal line and connected to the signal line in parallel, may be designed to pass the signal of the stop band to thus attenuate the signal of the stop band in the signal line, and the attenuation level of the tunable filter 320 may be adjusted so that the signal strength transferred to the signal line in the stop band 420 satisfies a required strength.

According to an embodiment, to tune the tunable filter 320, the processor 120 may detect the signal strength outputted from the tunable filter 320 by using the detector 516, and tune the pass band of the tunable filter 320 using the controller 517. The detector 516 may detect the signal strength passing through the tunable filter 320. The detected signal strength is forwarded to the processor 120, and the processor 120 may determine the frequency of the pass band of the tunable filter 320 to attenuate the signal of the stop band 420 based on the signal strength. The pass band of the tunable filter 320 may be the stop band of the fixed filter 310.

According to an embodiment, the processor 120 may divide the stop band 420 into two or more frequency bands, and request the controller 517 to pass one of the two or more frequency bands through the tunable filter 320. For example, the processor 120 may request the controller 517 to operate the tunable filter 320 with reference attenuation. The processor 120 may detect the signal strength of a frequency band corresponding to a stop band from the detector 516. Based on the detected signal strength, the processor 120 may determine the frequency band to filter out using the tunable filter 320 and the attenuation level. For example, the processor 120 may request the controller 517 to filter the signal with the reference attenuation (e.g., 10 dB) at the tunable filter 320. The processor 120 may receive the detected signal strength from the detector 516. In so doing, the processor 120 may compare the signal strength outputted through the tunable filter 320 with a predetermined value (e.g., −50 dBm). The predetermined value may be different for different frequency bands. According to an embodiment, provided that the signal strength detected in a first frequency band is −60 dBm and no signal strength is detected in other frequency bands, the processor 120 may determine not to use the tunable filter 320. Thus, the insertion loss (e.g., 2 dBm) in the pass band through the tunable filter 310 may be reduced. According to another embodiment, if the signal strength detected in the first frequency band is −60 dBm and the signal strength detected in a second frequency band is −30 dBm, the processor 120 may determine the second frequency band as the frequency band to be filtered out by the tunable filter 320. For example, provided that the signal strength not causing problems is −50 dBm, if the signal strength detected in the second frequency band is −30 dBm, the processor 120 may control the controller 517 to further attenuate the signal by 20 dB more from the reference attenuation (e.g., 10 dB) at the tunable filter 320. In this case, the insertion loss of the pass band through the tunable filter 310 may increase. For example, if the attenuation of the stop band of the tunable filter 320 is 30 dB, the total insertion loss of the pass band may be 50 dB by adding the insertion loss 3 dB of the tunable filter 320 to the insertion loss 2 dB of the fixed filter. Hence, the insertion loss (e.g., 5 dB) in the pass band through the fixed filter 310 may occur. Such insertion loss may deteriorate the system performance.

According to an embodiment, during the signal transmission, the processor 120 may adjust the gain of the PA 515 by controlling the controller 517, to address the system performance deterioration caused by the insertion loss. By adjusting the gain of the PA 515, the signal strength passing through the fixed filter 510 may increase, including both in the pass band and in the stop band. Thus, the attenuation level of the tunable filter 320 may be re-tuned by newly detecting the output of the detector 516 based on the current gain of the PA 515 and the attenuation level of the tunable filter 320. The processor 120 may control to decrease the insertion loss by recursively setting the gain of the PA 515 and the attenuation level of the tunable filter 320 and to meet the required signal strength of the stop band.

According to an embodiment, the attenuation level to be achieved in the stop band 420 may be determined depending on network characteristics. There may be existing regulations that prevent components of one communication system from affecting performance of other communication system, and in one embodiment the attenuation level of the stop band 420 may be acquired to satisfy the regulations. For example, the WiFi channel 13 of the unlicensed band 2.4 GHz generally needs to achieve attenuation of about 40 dB at the frequency 2.483 GHz. However, low attenuation level of the stop band in this case may not be problematic if there is no other communication system such as WiFi in vicinity. In this case, low attenuation level may be set.

Figure 6:
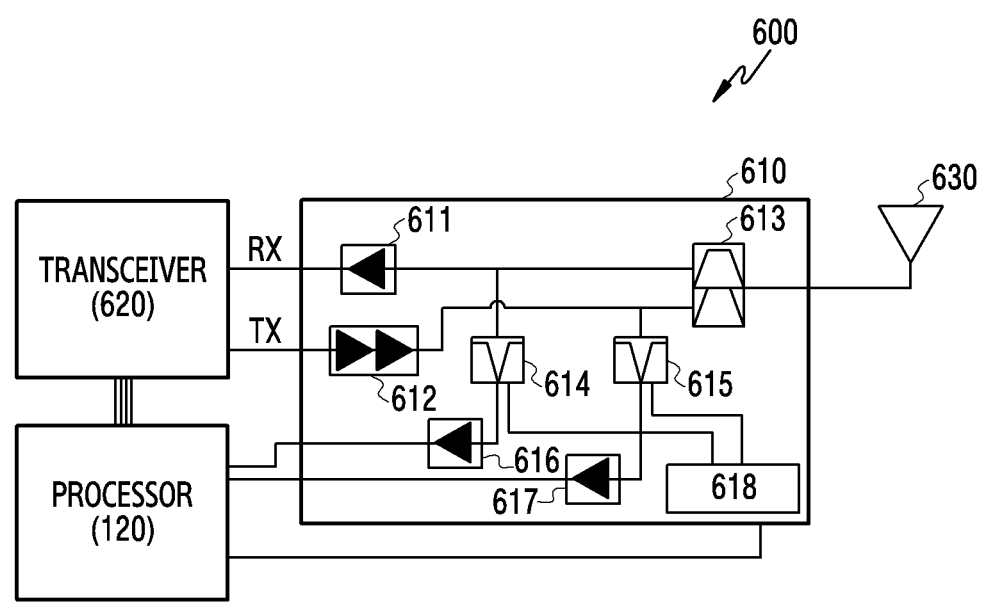
FIG. 6 illustrates a block diagram of a tunable RF circuit for frequency division duplex (FDD) according to an embodiment of the disclosure.

FIG. 6 illustrates a block diagram 600 of a tunable RF circuit for FDD according to an embodiment.

Referring to FIG. 6, the tunable RF circuit 610 for FDD according to an embodiment may be connected to an antenna 630, a transceiver 620, and a processor 120. According to other embodiments, the antenna 630 may be included in the tunable RF circuit 610. The transceiver 620 may include an RFIC 210 and/or an IFIC (not shown). The processor 120 may be a general-purpose processor, an ASIC, or a modem for processing communication protocol. The tunable RF circuit 610 for FDD according to an embodiment may include an LNA 611 for amplifying received signals in the reception path, a PA 612 for determining power of the transmit signals in the transmission path, a duplexer 613 for filtering the transmit signals and the received signals, tunable filters 614 and 615, detectors 616 and 617 for detecting output signal strengths of the tunable filters 614 and 615, and a controller 618 for controlling the pass bands and the attenuation levels of the tunable filters 614 and 615. The controller 618 may tune the transmit signal strengths by controlling the PA 612. According to an embodiment, if the processor 120 functions as the controller 618, the controller 618 may be omitted.

According to an embodiment, since the transmit signals and the received signals are in different frequency bands, FDD may be filtered by a combination of the duplexer 613 and/or the tunable filters 614 and 615 which filter the frequency band of the transmit signals and the frequency band of the received signals. The combination of the duplexer 613 and/or the tunable filters 614 and 615 for the received signal or the transmit signal may be substantially the same as the equivalent circuit of FIG. 3. The duplexer 613 may be designed to pass the signal of the determined transmit frequency band or receive frequency band (the pass band) and to attenuate signals of other frequency bands (the stop band). The attenuation level of the tunable filters 614 and 615 may be tuned such that the signal strength transferred to the signal line in the stop band 420 satisfies a required signal strength.

According to an embodiment, to tune the tunable filters 614 and 615, the processor 120 may detect the signal strengths outputted from the tunable filters 614 and 615 by use of the detectors 616 and 617, and tune the pass band of the tunable filters 614 and 615 using the controller 618. The detectors 616 and 617 may detect the signal strengths passing through the tunable filters 614 and 615. The detected signal strengths are provided to the processor 120, and the processor 120 may determine frequencies of the pass bands of the tunable filters 614 and 615, which may be the stop band of the signal, to attenuate the signal in the stop band 420 based on the signal strengths. In so doing, the tunable filter 615 and the detector 617 for the transmit signals and the tunable filter 614 and the detector 616 for the received signals may be separated to independently process the transmit signals and the received signals.

According to an embodiment, the processor 120 may divide the stop band 420 into two or more frequency bands, and request the controller 618 to pass one of the two or more frequency bands through the tunable filters 614 and 615. In so doing, the processor 120 may request the controller 618 to operate the tunable filters 614 and 615 with reference attenuation. The processor 120 may detect the signal strength of the corresponding frequency band from the detectors 616 and 617. The processor 120 may detect the signal strength of at least one frequency band corresponding to the stop band 420 in the aforementioned manner. Based on the detected signal strength, the processor 120 may determine the frequency bands to filter out using the tunable filters 614 and 615 and the attenuation level. For example, the processor 120 may request the controller 618 to receive the signal with the reference attenuation (e.g., 10 dB) at the tunable filters 614 and 615. The processor 120 may receive the detected signal strength from the detectors 616 and 617. In so doing, the processor 120 may compare the signal strength outputted through the tunable filters 614 and 615 with a predetermined value (e.g., −50 dBm). The predetermined value may be different for different frequency bands. According to an embodiment, provided that the signal strength detected in the first frequency band is −60 dBm and no signal strength is detected in other frequency band, the processor 120 may determine not to use the tunable filters 614 and 615. Thus, the insertion loss (e.g., 0 dBm) in the pass band through the duplexer 613 may be reduced. According to another embodiment, if the signal strength detected in the first frequency band is −60 dBm and the signal strength detected in the second frequency band is −30 dBm, the processor 120 may determine the second frequency band as the frequency band to be filtered out by the tunable filters 614 and 615. Provided that the signal strength not causing problems is −50 dBm, if the signal strength detected in the second frequency band is −30 dBm, the processor 120 may control the controller 618 to further attenuate the signal by 20 dB more from the reference attenuation (e.g., 10 dB) at the tunable filter 320. In this case, the insertion loss in the pass band through the duplexer 613 may occur. For example, if the attenuation of the stop band of the tunable filters 614 and 615 is 10 dB, the attenuation of the pass band may be 2 dB. In so doing, if the attenuation level of the stop band of the tunable filters 614 and 615 is increased to 30 dB for additional attenuation, the total insertion loss may be 5 dB by adding the insertion loss 3 dB to the existing insertion loss 2 dB. Such insertion loss may deteriorate the system performance.

According to an embodiment, during the signal transmission, the processor 120 may adjust the gain of the PA 612 by controlling the controller 618, to address the system performance deterioration caused by the insertion loss. By adjusting the gain of the PA 612, the signal strength passing through the duplexer 613 may increase, including both in the pass band and in the stop band. Thus, the attenuation level of the tunable filter 615 may be re-tuned by newly detecting the output of the detector 617 based on the current gain of the PA 612 and the attenuation level of the tunable filter 615. The processor 120 may control to minimize the insertion loss by recursively setting the gain of the PA 612 and the attenuation level of the tunable filter 615 and to meet the required attenuation level of the stop band.

Figure 7:
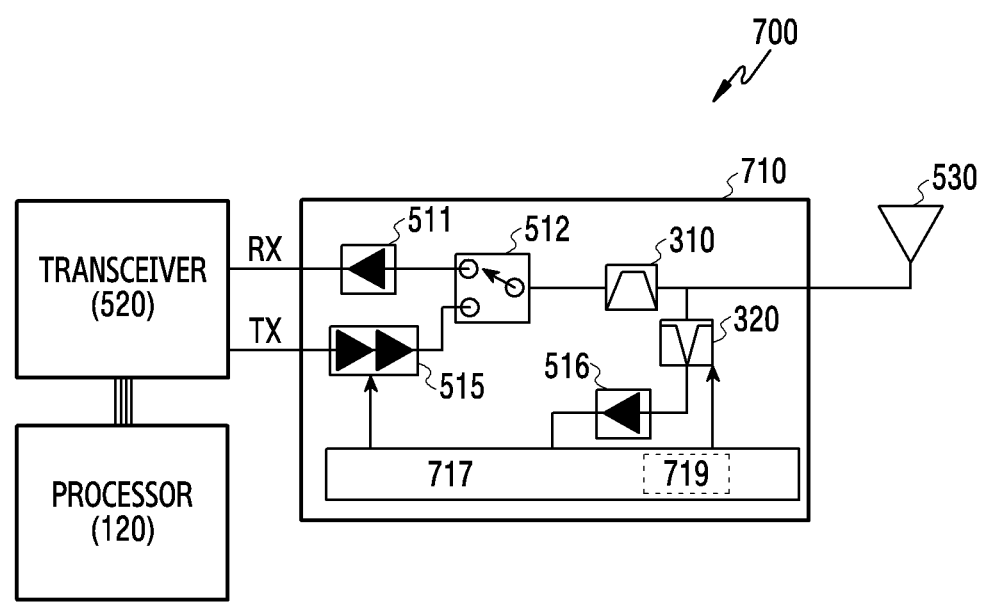
FIG. 7 illustrates a block diagram of a processor-embedded tunable RF circuit for TDD according to an embodiment of the disclosure.

FIG. 7 illustrates a block diagram 700 of a processor-embedded tunable RF circuit for TDD processor according to an embodiment.

Referring to FIG. 7, the processor-embedded tunable RF circuit 710 for TDD according to an embodiment may include an embedded processor 717 in the tunable RF circuit 510 for TDD of FIG. 5, and may further include a memory 719. In an embodiment, the operations of the processor 120 described in FIG. 5 may be carried out by the embedded processor 717 of the tunable RF circuit 710 for the TDD. If the network environment or characteristic changes in advanced communication systems such as 5G, the response rate may be improved using the embedded processor 717 in the processor-embedded tunable RF circuit 510 for the TDD. The processor-embedded tunable RF circuit 510 for TDD may be implemented as a single module including the processor.

According to an embodiment, while the processor is embedded in the tunable RF circuit 510 for TDD of FIG. 5 in FIG. 7, the processor may be embedded in the tunable RF circuit 510 for FDD of FIG. 6. In this case, the operations of the processor 120 may be carried out by the embedded processor 717.

Referring to FIG. 7, the processor-embedded tunable RF circuit 710 for the TDD may be connected to an antenna 530, a transceiver 520, and a processor 120. According to other embodiments, the antenna 530 may be included in the processor-embedded tunable RF circuit 710 for TDD. The transceiver 520 may include an RFIC 210 and/or an IFIC (not shown). The processor 120 may be a general-purpose processor, an ASIC, or a modem for processing communication protocol. The processor 120 may set parameters (e.g., stop band information, a signal strength required in the stop band) required for tuning the tunable filter 320.

According to an embodiment, the processor-embedded tunable RF circuit 710 for the TDD may include an LNA 511 for amplifying received signals in the reception path, a PA 515 for determining power of transmit signals in the transmission path, a switch 512 for switching transmission and reception paths for the signals, a fixed filter 310 for filtering the transmit signals and the received signals, a tunable filter 320, a detector 516 for detecting the output signal strength of the tunable filter 320, and an embedded processor 717 for controlling the pass band and the attenuation level of the tunable filter 320. The embedded processor 717 may tune the transmit signal strength by controlling the PA 515. For example, the processor-embedded tunable RF circuit 710 for TDD may further include a memory 719, and thus may store the parameters set by the processor 120 in the memory 719 and periodically store the signal strength detected by the detector 516 in the memory 719.

According to an embodiment, the transmit signals or the received signals may be filtered by a combination of the fixed filter 310 and/or the tunable filter 320 as shown in FIG. 3 and FIG. 4. The fixed filter 310 may be designed to pass signals in a determined frequency band (the pass band 410) and to attenuate signals in other frequency bands (the stop band). The attenuation level of the tunable filter 320 may be adjusted so that the signal strength transferred to the signal line in the stop band 420 satisfies the required strength.

According to an embodiment, to tune the tunable filter 320, the embedded processor 717 may detect the signal strength outputted from the tunable filter 320 by using the detector 516, and tune the pass band of the tunable filter 320. The detector 516 may detect the signal strength passing through the tunable filter 314. The detected signal strength is forwarded to the embedded processor 717, and the embedded processor 717 may determine the frequency of the pass band of the tunable filter 320, which may be the stop band of the signal line, to attenuate the signal of the stop band 420 based on the signal strength.

According to an embodiment, the embedded processor 717 may be configured to divide the stop band 420 into two or more frequency bands and to pass one of the two or more frequency bands through the tunable filter 320. In so doing, the embedded processor 717 may operate the tunable filter 320 with reference attenuation. The embedded processor 717 may detect the signal strength of a frequency band corresponding to a stop band from the detector 516. Based on the detected signal strength, the embedded processor 717 may determine the frequency band to filter out using the tunable filter 320 and the attenuation level. For example, the embedded processor 717 may allow the tunable filter 320 to receive the signal with the reference attenuation (e.g., 10 dB). The embedded processor 717 may receive the detected signal strength from the detector 516. In an embodiment, the embedded processor 717 may compare the signal strength outputted through the tunable filter 320 with a predetermined value (e.g., −50 dBm). For example, the predetermined value may different for different frequency bands.

According to an embodiment, provided that the signal strength detected in the first frequency band is −60 dBm and no signal strength is detected in other frequency band, the embedded processor 717 may determine not to use the tunable filter 320. Thus, the insertion loss (e.g., 2 dBm) in the pass band through the fixed filter 310 may be reduced. According to another embodiment, if the signal strength detected in the first frequency band is −60 dBm and the signal strength detected in the second frequency band is −30 dBm, the embedded processor 717 may determine the second frequency band as the frequency band to be filtered out by the tunable filter 320. For example, provided that the signal strength not causing problems is −50 dBm, if the signal strength detected in the second frequency band is −30 dBm, the embedded processor 717 may control the tunable filter 320 to further attenuate the signal by 20 dB more from the reference attenuation (e.g., 10 dB). In this case, the insertion loss in the pass band through the fixed filter 310 may occur. For example, if the attenuation of the stop band of the tunable filter 320 is 30 dB, the total insertion loss of the pass band may be 5 dB by adding the insertion loss 3 dB of the tunable filter 320 to the insertion loss 2 dB of the fixed filter 310. Such insertion loss may deteriorate the system performance.

According to an embodiment, during the signal transmission, the embedded processor 717 may adjust the gain of the PA 515, to address the system performance deterioration caused by the insertion loss. By adjusting the gain of the PA 515, the signal strength passing through the fixed filter 510 may increase, including both in the pass band and in the stop band. Thus, the attenuation level of the tunable filter 320 may be re-tuned by newly detecting the output of the detector 516 based on the current gain of the PA 515 and the attenuation level of the tunable filter 320. The embedded processor 717 may control to minimize the insertion loss by recursively setting the gain of the PA 515 and the attenuation level of the tunable filter 320 and to satisfy the required attenuation level of the stop band.

According to an embodiment, an electronic device (e.g., the electronic device of FIG. 1) may include an antenna (e.g., the antenna 530 of FIG. 5), a transceiver (e.g., the transceiver 520 of FIG. 5) configured to transmit and/or receive a signal via the antenna, a tunable RF circuit (e.g., the tunable RF circuit 510 of FIG. 5) configured to tune a signal strength of a frequency band of the signal between the antenna and the transceiver, and at least one processor (e.g., the processor 120 of FIG. 5) operatively coupled with the transceiver and the tunable RF circuit The tunable RF circuit (e.g., the tunable RF circuit 510 of FIG. 5) may include a switch (e.g., the switch 512 of FIG. 5) configured to switch the transmitting and the receiving of the signal, an LNA (e.g., the LNA 511 of FIG. 5) configured to amplify the signal in a reception path for receiving the signal from the switch to the transceiver, a PA (e.g., the PA 515 of FIG. 5) configured to determine a strength of the signal in a transmission path for transmitting the signal from the transceiver to the switch, a fixed filter (e.g., the fixed filter 310 of FIG. 5) disposed in a signal line connecting the switch and the antenna, configured to pass signals in a first frequency band, and attenuate signals in a second frequency band, at least one tunable filter (e.g., the tunable filter 320 of FIG. 5) divided from the signal line and configured to pass signals in at least a portion of the second frequency band, wherein the portion of the second frequency band is tunable, and at least one detector (e.g., the detector 516 of FIG. 5) configured to detect a signal strength passing through the at least one tunable filter.

According to an embodiment, the at least one processor (e.g., the processor 120 of FIG. 5) may be configured to determine a frequency band to be passed by the at least one tunable filter based on the signal strength detected by the at least one detector, and tune the at least one tunable filter to pass the determined frequency band.

According to an embodiment, the at least one processor (e.g., the processor 120 of FIG. 5) may be configured to adjust a gain of the PA.

According to an embodiment, the at least one processor (e.g., the processor 120 of FIG. 5) may be further configured to determine an attenuation level of signals in the determined frequency band based on a signal strength of the signals in the determined frequency band detected by the at least one detector, and tune the at least one tunable filter to attenuate the signal strength of the signals in the determined frequency band to the attenuation level.

According to an embodiment, the at least one processor (e.g., the processor 120 of FIG. 5) may be configured to tune the at least one tunable filter (e.g., the tunable filter 320 of FIG. 5) to pass the signals in the portion of the second frequency band-receive the signal strength passing through the at least one tunable filter from the at least one detector, compare the received signal strength to a predetermined value, and when the received signal strength is greater than the predetermined value, determine a frequency band to be filtered out by the at least one tunable filter in the portion of the second frequency band.

According to an embodiment, the at least one processor (e.g., the processor 120 of FIG. 5) may be further configured to determine whether the determined frequency band and the attenuation level of the signals in the determined frequency band require additional tuning, by monitoring the signal strength of the signals in the determined frequency band passing through the at least one tunable filter (e.g., the tunable filter 320 of FIG. 5) using the at least one detector.

According to an embodiment, the tunable RF circuit (e.g., the tunable RF circuit 510 of FIG. 7) may further include an embedded processor (e.g., the embedded processor 717 of FIG. 7), and the embedded processor (e.g., the embedded processor 717 of FIG. 7) may be configured to determine a frequency band to be passed by the at least one tunable filter based on the signal strength detected by the at least one detector, and tune the at least one tunable filter to pass the determined frequency band.

According to an embodiment, an electronic device (e.g., the electronic device 101 of FIG. 1) may include an antenna (e.g., the antenna 630 of FIG. 6), a transceiver (e.g., the transceiver 620 of FIG. 6) configured to transmit and/or receive a signal via the antenna, a tunable RF circuit (e.g., the tunable RF circuit 610 of FIG. 6) configured to tune frequency band characteristics of the signal between the antenna and the transceiver, and at least one processor (e.g., the processor 120 of FIG. 6) operatively coupled with the transceiver and the tunable RF circuit. The tunable RF circuit (e.g., the tunable RF circuit 610 of FIG. 6) may include a duplexer (e.g., the duplexer 613 of FIG. 6) including a first fixed filter which passes signals in a first frequency band and attenuating signals in a second frequency band in a transmit signal transmitted from the transceiver to the antenna, and a second fixed filter which passes signals in a third frequency band and attenuating signals in a fourth frequency band in a receive signal transmitted from the antenna to the transceiver, at least one first tunable filter (e.g., the tunable filter 615 of FIG. 6) configured to pass signals in at least a portion of the second frequency band of the transmit signal, and tune the portion of the second frequency band, at least one second tunable filter (e.g., the tunable filter 614 of FIG. 6) configured to pass signals in at least a portion of the fourth frequency band of the receive signal, and tune the portion of the fourth frequency band, an LNA (e.g., the LNA 611 of FIG. 6) configured to amplify the receive signal, a PA (e.g., the PA 612 of FIG. 6) configured to determine a power of the transmit signal, at least one first detector (e.g., the detector 617 of FIG. 6) configured to detect a first signal strength passing through the at least one first tunable filter, and at least one second detector (e.g., the detector 616 of FIG. 6) configured to detect a second signal strength passing through the at least one second tunable filter.

According to an embodiment, the at least one processor (e.g., the processor 120 of FIG. 6) may be configured to determine a frequency band of the second frequency band to be passed by the at least one first tunable filter based on the first signal strength detected by the at least one first detector, tune the at least one first tunable filter to pass the determined frequency band of the second frequency band, determine a frequency band of the fourth frequency band to be passed by the at least one second tunable filter based on the second signal strength detected by the at least one second detector, and tune the at least one second tunable filter to pass the determined frequency band of the fourth frequency band.

According to an embodiment, the at least one processor (e.g., the processor 120 of FIG. 6) may be configured to adjust a gain of the PA.

According to an embodiment, the at least one processor (e.g., the processor 120 of FIG. 6) may be further configured to determine a first attenuation level of signals in the determined frequency band of the second frequency band based on a third signal strength of the signals in the determined frequency band of the second frequency band detected by the at least one first detector, tune the at least one first tunable filter to attenuate the signal strength of the signals in the determined frequency band of the second frequency band to the first attenuation level, determine a second attenuation level of signals in the determined frequency band of the fourth frequency band based on a fourth signal strength of the signals in the determined frequency band of the fourth frequency band detected by the at least one second detector, and tune the at least one second tunable filter to attenuate the signal strength of the signals in the determined frequency band of the fourth frequency band to the second attenuation level.

According to an embodiment, the at least one processor (e.g., the processor 120 of FIG. 6) may be configured to tune the at least one first tunable filter to pass the signals in the portion of the second frequency band, receive the first signal strength from the at least one first detector, compare the received first signal strength to a predetermined first value, when the received first signal strength is greater than the predetermined first value, determine a frequency band to be passed by the at least one first tunable filter in the portion of the second frequency band, tune the at least one second tunable filter to pass the signals in the portion of the fourth frequency band, receive the second signal strength from the at least one second detector, compare the received second signal strength to a predetermined second value, and when the received second signal strength is greater than the predetermined second value, determine a frequency band to be passed by the at least one second tunable filter in the portion of the fourth frequency band.

According to an embodiment, the at least one processor (e.g., the processor 120 of FIG. 6) may be further configured to determine whether the determined frequency band of the second frequency band and the first attenuation level require additional tuning, by monitoring the signal strength of the signals in the determined frequency band of the second frequency band passing through the at least one first tunable filter using the at least one first detector, and determine whether the determined frequency band of the fourth frequency band and the second attenuation level require additional tuning, by monitoring the signal strength of the signals in the determined frequency band of the fourth frequency band passing through the at least one second tunable filter using the at least one second detector.

According to an embodiment, the tunable RF circuit (e.g., the tunable RF circuit 610 of FIG. 6) may further include an embedded processor (e.g., the embedded processor 717 of FIG. 7). The embedded processor may be configured to determine at least one frequency band of the second frequency band to be passed by the at least one first tunable filter based on the first signal strength detected by the at least one first detector, tune the at least one first tunable filter to pass the determined at least one frequency band of the second frequency band, determine at least one frequency band of the fourth frequency band to be passed by the at least one second tunable filter based on the second signal strength detected by the at least one second detector, and tune the at least one second tunable filter to pass the determined at least one frequency band of the fourth frequency band.

The following explanations provide a control method for minimizing the insertion loss of the pass band and achieving the required attenuation level of the stop band using the above-stated tunable RF circuit.

Figure 8:
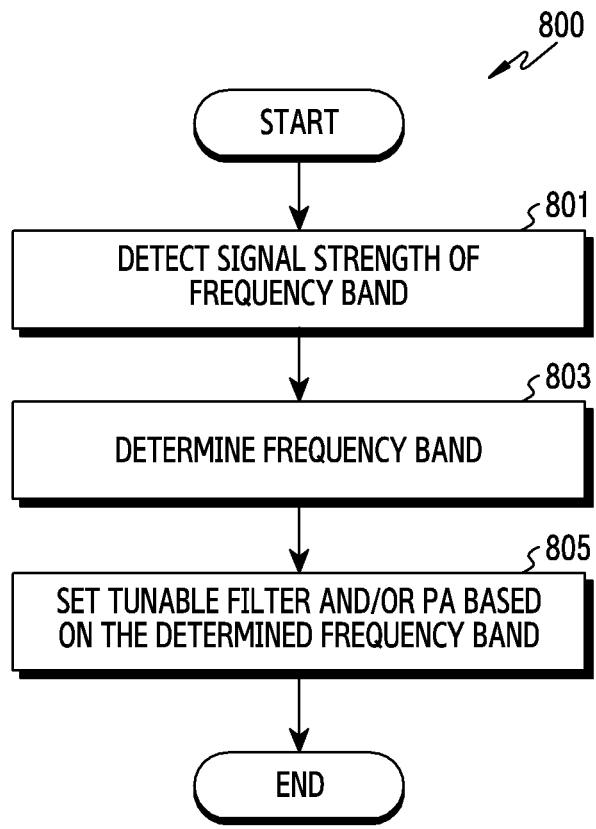
FIG. 8 illustrates a flowchart of a method for tuning an RF circuit of an electronic device including a tunable RF circuit according to an embodiment of the disclosure.

FIG. 8 illustrates a flowchart 800 of a method for tuning an RF circuit of an electronic device including the tunable RF circuit according to an embodiment. The operating entity of the flowchart 800 of FIG. 8 may be understood as the electronic device (e.g., the electronic device 101 of FIG. 1 or a base station not shown) or the component (e.g., the processor 120 of FIG. 1 and/or the embedded processor 717 of FIG. 7) of the electronic device.

According to an embodiment, in operation 801, the processor 120 or the embedded processor 717 may detect a signal strength, using the detector 516, of the frequency band which may be filtered out by the tunable filter 320, 614, or 615. The tunable filter 320, 614, or 615 may tune a resonant frequency or the pass band by changing the value of the variable inductor 321 and/or the variable capacitor 322 as shown in FIG. 3. The processor 120 or the embedded processor 717 may determine at least one pass band of the tunable filter 320, 614, or 615. The processor 120 or the embedded processor 717 may determine the pass band based on the tunable range of the tunable filter 320, 614, or 615 and the pass band of the fixed filter 310 and the duplexer 613. According to an embodiment, the stop band 420 near the pass band 410 of the fixed filter 310 may be divided into two or more frequency bands and thus the pass band of the tunable filter 320, 614, or 615 may be set to be one of the two or more bands of the stop band 420. The processor 120 or the embedded processor 717 may tune the tunable filter 320, 614, or 615 to pass their pass band, and detect the signal strength passing through the tunable filter 320, 614, or 615 using the detector 516, 616, or 617.

According to an embodiment, in operation 803, the processor 120 or the embedded processor 717 may determine the frequency band to be filtered out by the tunable filter 320, 614, or 615 by comparing the signal strength in a frequency band detected in operation 801 with the required signal strength (e.g., −50 dBm) of the frequency band. According to an embodiment, provided that the signal strength detected in the first frequency band is −60 dBm and no signal strength is detected in other frequency bands, the processor 120 or the embedded processor 717 may determine not to use the tunable filter 320, 614, or 615. The insertion loss (e.g., 2 dBm) in the pass band through the fixed filter 310 or the duplexer 613 may be reduced. According to another embodiment, if the signal strength detected in the first frequency band is −60 dBm and the signal strength detected in the second frequency band is −30 dBm, the processor 120 or the embedded processor 717 may determine the second frequency band as the frequency band to be filtered out by the tunable filter 320.

According to an embodiment, in operation 805, the processor 120 or the embedded processor 717 may set the frequency pass band and the attenuation level of the tunable filter 320, 614, or 615, based on the frequency band determined in operation 803. For example, if the determined frequency band is the second frequency band, the processor 120 or the embedded processor 717 may determine the pass band of the tunable filter 320, 614, or 615 as the second frequency band. For example, the processor 120 or the embedded processor 717 may determine the attenuation level of the tunable filter 320, 614, or 615, based on the signal strength detected in the determined frequency band. According to an embodiment, provided that the attenuation level of the tunable filter 320, 614, or 615 is set to 10 dB and measured in operation 801, the detected signal strength is −30 dBm, and the signal strength not causing problems is −50 dBm, the processor 120 or the embedded processor 717 may reset the attenuation level of the tunable filter 320, 614, or 615 based on the detected attenuation level, such that the signal strength detected in the determined frequency band becomes the required signal strength (e.g., −50 dBm). According to an embodiment of the disclosure, by determining to further decrease the signal strength by 20 dB or so in the determined frequency band, the processor 120 or the embedded processor 717 may set the attenuation level of the tunable filter 320, 614, or 615 to 30 dB to be higher than the reference attenuation by 20 dB.

According to an embodiment, during the signal transmission, the processor 120 or the embedded processor 717 may adjust the gain of the PA 515 or 612, to address the system performance deterioration caused by the insertion loss. By adjusting the gain of the PA 515 or 612, the signal strength passing through the fixed filter 510 or the duplexer 613 may increase, including both in the pass band and in the stop band. The attenuation level of the tunable filter 320, 614, or 615 may be re-tuned by newly detecting the output of the detector 516, 616, or 617 based on the current gain of the PA 515 or 612 and the attenuation level of the tunable filter 320, 614, or 615. The processor 120 or the embedded processor 717 may control to meet the required signal strength of the stop band, to minimize the insertion loss, and to meet the required attenuation level of the stop band by recursively setting the gain of the PA 515 or 612 and the attenuation level of the tunable filter 320, 614, or 615.

According to an embodiment, operations of FIG. 8 may be performed individually and independently in the transmission and the reception in TDD and FDD.

In the operations of FIG. 8, the tunable filter 320, 614, or 615 and/or the PA 515 or 612 may be configured to minimize the insertion loss of the pass band and to satisfy the signal strength so that no problems are caused in the stop band. However, the influential frequency band may change due to network conditions, and the signal strength attenuated by the tunable filter 320, 614, or 615 may reduce considerably. In this case, the processor 120 or the embedded processor 717 may reset the tunable filter 320, 614, or 615 and/or the PA 515 or 612 to minimize the insertion loss of the pass band and to satisfy the signal strength of the stop band, by adapting to the new network environment by re-performing the operations of FIG. 8.

Figure 9:
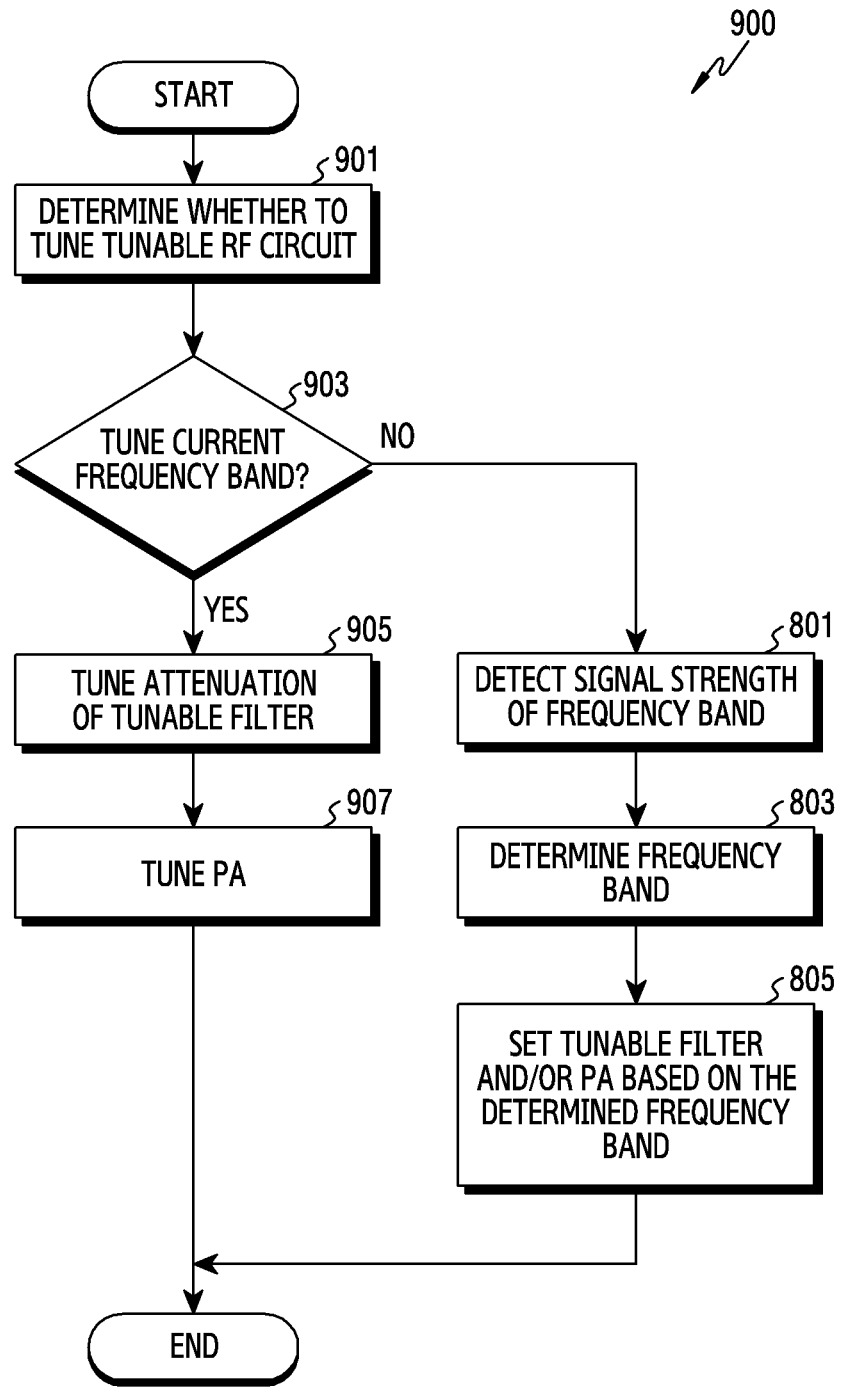
FIG. 9 illustrates a flowchart of a method for re-tuning an RF circuit due to a circumstantial change of an electronic device including a tunable RF circuit according to an embodiment of the disclosure.

FIG. 9 illustrates a flowchart 900 of a method for re-tuning an RF circuit due to a circumstantial change of an electronic device including a tunable RF circuit according to an embodiment. The operating entity of the flowchart 900 of FIG. 9 may be understood as the electronic device (e.g., the electronic device 101 of FIG. 1 or a base station not shown) or the component (e.g., the processor 120 of FIG. 1 and/or the embedded processor 717 of FIG. 7) of the electronic device.

According to an embodiment, in operation 901, the processor 120 or the embedded processor 717 may determine whether it is necessary to tune the frequency band currently filtered out by the tunable filter 320, 614, or 615 or the signal attenuation level of the frequency band. According to an embodiment, the processor 120 or the embedded processor 717 may determine that the tuning is required based on a user's tune request input. Alternatively, the processor 120 or the embedded processor 717 may determine that the tuning is required if certain parameters (e.g., stop band information, or the required signal strength of the stop band) are changed. According to another embodiment, the processor 120 or the embedded processor 717 may determine that the tuning is required if the pass band of the fixed filter 310 or the duplexer 613 is changed, or may determine that the tuning is required, based on the signal strength of the frequency band detected by the detector 516, 616, or 617 and currently set at the tunable filter 320, 614, or 615.

According to an embodiment, in operation 903, the processor 120 or the embedded processor 717 may determine whether it is necessary to tune the frequency band currently set at the tunable filter 320, 614, or 615 without detecting the signal strength of at least one or more frequency band of the tunable filter 320, 614, or 615. For example, the frequency band may be tuned according to user input. But alternatively, if the signal strength detected by the detector 516, 616, or 617 in the current frequency band of the tunable filter 320, 614, or 615 increases from −50 dBm to −40 dBm, the processor 120 or the embedded processor 717 may determine that it is necessary to tune this frequency band. According to another embodiment, if the signal strength detected by the detector 516, 616, or 617 in the current frequency band of the tunable filter 320, 614, or 615 reduces to below −70 dBm, the processor 120 or the embedded processor 717 may determine that it is not necessary to filter out this frequency band and may filter out the signal in a different frequency band by re-detecting the signal strength in another frequency band.

According to an embodiment, if determining that it is necessary to tune the frequency band currently set at the tunable filter 320, 614, or 615, the processor 120 or the embedded processor 717 may tune the attenuation level of the tunable filter 320, 614, or 615 in operation 905. For example, if the current attenuation level of the tunable filter 320, 614, or 615 is 60 dB and the detected signal strength changes from −50 dBm to −40 dBm, the processor 120 or the embedded processor 717 may increase the attenuation level of the tunable filter 320, 614, or 615 to 40 dB, to lower the detected signal strength back to −50 dBm.

According to an embodiment, during signal transmission, the processor 120 or the embedded processor 717 may tune the gain of the PA 515 or 612 to address the system performance degradation caused by insertion loss and to radiate the signal at the required signal strength in operation 907. If the processor 120 or the embedded processor 717 tunes the gain of the PA 515 or 612, the strength of the signal passing through the fixed filter 310 or the duplexer 613 may increase, including both in the pass band and in the stop band. The signal strength passing through the tunable filter 320, 614, or 615 and detected by the detector 516, 616, or 617 may not satisfy the required signal strength. Hence, the processor 120 or the embedded processor 717 may set the gain of the PA 515 or 612 and the attenuation level of the tunable filter 320, 614, or 615, to satisfy the required signal strength of the pass band signal and concurrently to satisfy the current signal strength of the frequency band of the tunable filter 320, 614, or 615, by repeating operations 905 and 907.

According to an embodiment, in operation 903, the processor 120 or the embedded processor 717 may determine that it is necessary to detect the signal strength in at least one or more frequency bands of the tunable filter 320, 614, or 615. A new frequency band to be filtered out at the tunable filter 320, 614, or 615, the attenuation level, and/or the PA gain may be set by performing operation 801, 803 and 805 of FIG. 8.

Figure 10:
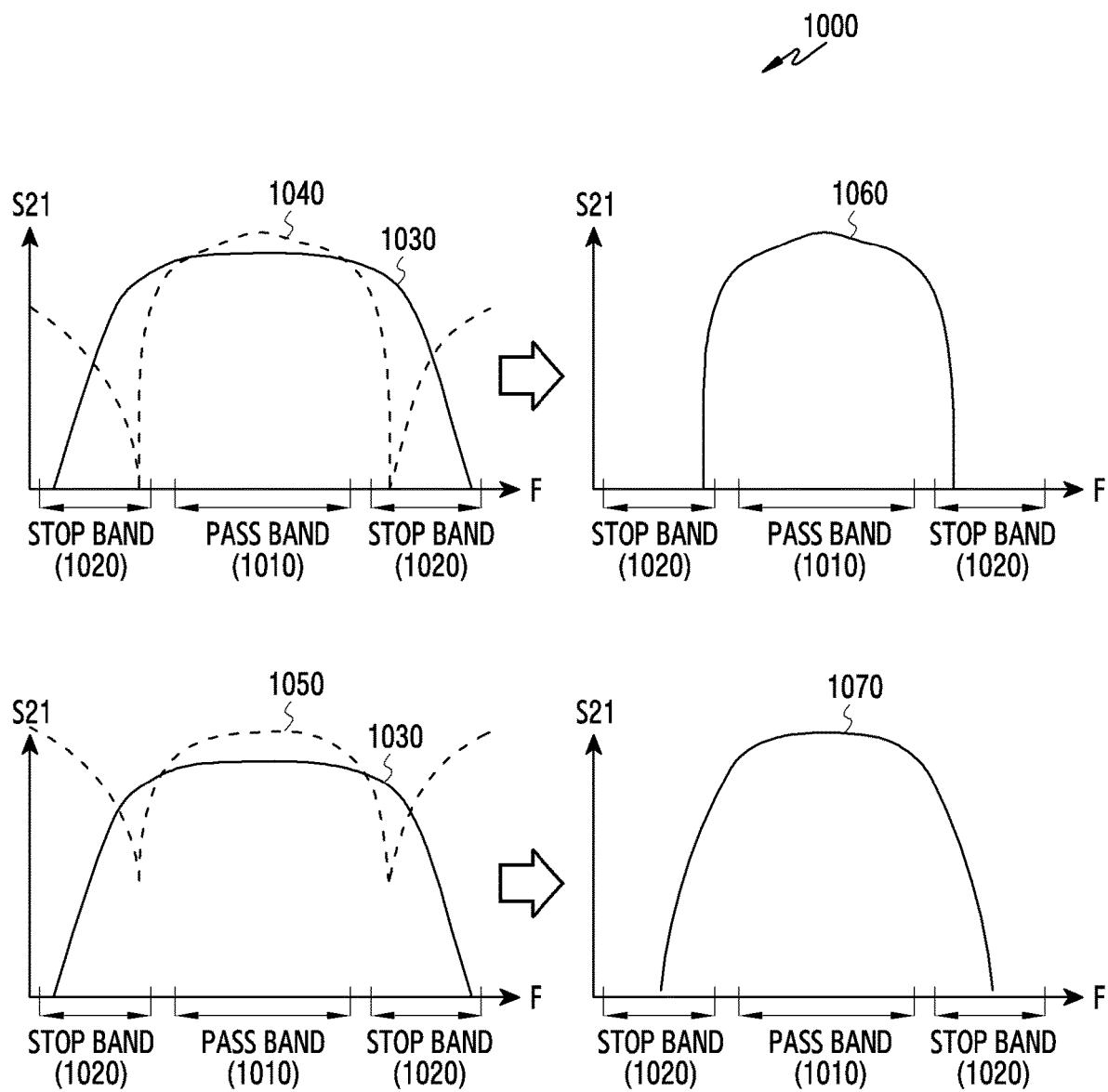
FIG. 10 illustrates a diagram of examples of frequency characteristics exhibited by an RF circuit tuning method of an electronic device including a tunable RF circuit according to one or more embodiment of the disclosure.

FIG. 10 illustrates a diagram 1000 of examples of frequency characteristics generated by an RF circuit tuning method of an electronic device including a tunable RF circuit according to one or more embodiments.

Referring to FIG. 10, if the strength of an unnecessary signal is considerable in the stop band beside the pass band of the fixed filter 310 or the duplexer 613, the attenuation level of the tunable filter 320, 614, or 615 may be increased, so that the signal strength of the signal line reaches the required signal strength. In another example, if the strength of the unnecessary signal is low in the stop band beside the pass band of the fixed filter 310 or the duplexer 613, the attenuation level of the tunable filter 320, 614, or 615 may be decreased. In FIG. 10, final frequency characteristics 1060 may be produced by combining frequency characteristics 1030 of the fixed filter 310 or the duplexer 613 and frequency characteristics 1040 of the tunable filter 320, 614, or 615 of the increased attenuation, and final frequency characteristics 1070 may be produced by combining the frequency characteristics 1030 of the fixed filter 310 or the duplexer 613 and frequency characteristics 1050 of the tunable filter 320, 614, or 615 of the decreased attenuation. Hence, the insertion loss of the pass band 1010 of the frequency characteristics 1070 may be lower than the insertion loss of the pass band 1010 of the frequency characteristics 1060.

According to an embodiment, a method for operating an electronic device (e.g., electronic device 101 of FIG. 1) may include detecting a signal strength of at least one frequency band passed by a tunable filter (e.g., the tunable filter 320 of FIG. 5 or FIG. 7, the tunable filter 614 and 615 of FIG. 6), determining a frequency band to be passed by the tunable filter based on the detected signal strength of the at least one frequency band, and tuning the tunable filter to pass the determined frequency band.

According to an embodiment, the operating method of the electronic device (e.g., electronic device 101 of FIG. 1) may further include determining an attenuation level of a signal in the determined frequency band to be attenuated by the tunable filter based on another signal strength of the signal in the determined frequency band, and tuning the tunable filter to attenuate the signal strength of the signal in the determined frequency band to the attenuation level.

According to an embodiment, the operating method of the electronic device (e.g., electronic device 101 of FIG. 1) may further include adjusting strength of a transmit signal transmitted via an antenna based on the determined attenuation level.

According to an embodiment, the operating method of the electronic device (e.g., electronic device 101 of FIG. 1) may further include, after adjusting the strength of the transmit signal, re-detecting the signal strength of the signal in the determined frequency band attenuated by the tunable filter, and tuning the tunable filter to another attenuation level and attenuate the signal strength of the signal in the determined frequency band to the other attenuation level.

According to an embodiment, the determining of the frequency band to be passed by the tunable filter based on the detected signal strength of the frequency band may include comparing the detected signal strength of the at least one frequency band with a predetermined value, and when the detected signal strength of the at least one frequency band is greater than the predetermined value, determining the frequency band to be passed by the tunable filter in the at least one frequency band.

According to an embodiment, the operating method of the electronic device (e.g., electronic device 101 of FIG. 1) may further include monitoring another signal strength of a signal in the determined frequency band which passes the tunable filter, and, based on a result of the monitoring, determining whether the determined frequency band and an attenuation level of the signal in the determined frequency band require additional tuning.

The circuit, the apparatus and/or the method according to the disclosure may actively attenuate unnecessary signals by measuring the unnecessary frequency and its signal strength in the realtime. In addition, as the fixed filter and the tunable filter are used and adaptively operated in the realtime, the fixed filter may be implemented using a SAW or a ceramic fixed filter which has a low Q value and a moderate price, thus lowering the unit cost of the system and/or the device.

A tunable filter according to an embodiment may improve system performance because the filter may be tuned according to realtime operational environments so that unnecessary signals may be filtered out.

An electronic device or a system including a tunable filter according to an embodiment may lower the unit cost of the system by implementing the filter using a SAW or a ceramic fixed filter which has a low Q value and moderate price.

An electronic device according to an embodiment, including a tunable filter of the disclosure, may improve reception performance and transmission performance in communication.

Methods according to various example embodiments of the present disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The one or more program may include instructions that cause the electronic device to perform the methods according to various embodiments of the present disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Any combination of some or all of them may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

In the above-described example embodiments of the present disclosure, a component included in the present disclosure is expressed in the singular or the plural according to a presented example embodiment. However, the singular form or plural form is selected for convenience of description suitable for the presented situation, and various example embodiments of the present disclosure are not limited to a single element or multiple elements thereof. Further, either multiple elements expressed in the description may be configured into a single element or a single element in the description may be configured into multiple elements.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been illustrated and described with reference to various example embodiments thereof, it will be understood by those skilled in the art that various changes in form and details may be made therein without departing from the true spirit and full scope of the present disclosure.

What is claimed is:

1. An electronic device comprising:
an antenna;
a transceiver configured to transmit and/or receive a signal via the antenna;
a tunable radio frequency (RF) circuit configured to tune a signal strength of a frequency band of the signal between the antenna and the transceiver; and
at least one processor operatively coupled with the transceiver and the tunable RF circuit,
wherein the tunable RF circuit includes:
a switch configured to switch the transmitting and the receiving of the signal;
a low noise amplifier (LNA) configured to amplify the signal in a reception path for receiving the signal from the switch to the transceiver;
a power amplifier (PA) configured to determine a strength of the signal in a transmission path for transmitting the signal from the transceiver to the switch;
a fixed filter disposed in a signal line connecting the switch and the antenna, configured to pass signals in a first frequency band, and attenuate signals in a second frequency band;
at least one tunable filter divided from the signal line and configured to pass signals in at least a portion of the second frequency band, wherein the portion of the second frequency band is tunable; and
at least one detector configured to detect a signal strength passing through the at least one tunable filter,
wherein the at least one processor or an embedded processor of the tunable RF circuit is configured to determine a frequency band to be passed by the at least one tunable filter based on the signal strength detected by the at least one detector, and tune the at least one tunable filter to pass the determined frequency band.

2. The electronic device of claim 1, wherein the at least one processor is further configured to:
tune the at least one tunable filter to pass the signals in the portion of the second frequency band;
receive the signal strength passing through the at least one tunable filter from the at least one detector;
compare the received signal strength to a predetermined value; and
when the received signal strength is greater than the predetermined value, determine a frequency band to be filtered out by the at least one tunable filter in the portion of the second frequency band.

3. The electronic device of claim 1, wherein the at least one processor is configured to adjust a gain of the PA.

4. The electronic device of claim 1, wherein the at least one processor is further configured to determine an attenuation level of signals in the determined frequency band based on a signal strength of the signals in the determined frequency band detected by the at least one detector, and tune the at least one tunable filter to attenuate the signal strength of the signals in the determined frequency band to the attenuation level.

5. The electronic device of claim 4, wherein the at least one processor is further configured to determine whether the determined frequency band and the attenuation level of the signals in the determined frequency band require additional tuning, by monitoring the signal strength of the signals in the determined frequency band passing through the at least one tunable filter using the at least one detector.

6. An electronic device comprising:
an antenna;
a transceiver configured to transmit and/or receive a signal via the antenna;
a tunable radio frequency (RF) circuit configured to tune frequency band characteristics of the signal between the antenna and the transceiver; and
at least one processor operatively coupled with the transceiver and the tunable RF circuit,
wherein the tunable RF circuit includes:
a duplexer including a first fixed filter which passes signals in a first frequency band and attenuating signals in a second frequency band in a transmit signal transmitted from the transceiver to the antenna, and a second fixed filter which passes signals in a third frequency band and attenuating signals in a fourth frequency band in a receive signal transmitted from the antenna to the transceiver;
at least one first tunable filter configured to pass signals in at least a portion of the second frequency band of the transmit signal, and tune the portion of the second frequency band;
at least one second tunable filter configured to pass signals in at least a portion of the fourth frequency band of the receive signal, and tune the portion of the fourth frequency band;
a low noise amplifier (LNA) configured to amplify the receive signal;
a power amplifier (PA) configured to determine a power of the transmit signal;
at least one first detector configured to detect a first signal strength passing through the at least one first tunable filter; and
at least one second detector configured to detect a second signal strength passing through the at least one second tunable filter.

7. The electronic device of claim 6, wherein the at least one processor is configured to:
determine a frequency band of the second frequency band to be passed by the at least one first tunable filter based on the first signal strength detected by the at least one first detector;
tune the at least one first tunable filter to pass the determined frequency band of the second frequency band;
determine a frequency band of the fourth frequency band to be passed by the at least one second tunable filter based on the second signal strength detected by the at least one second detector; and
tune the at least one second tunable filter to pass the determined frequency band of the fourth frequency band.

8. The electronic device of claim 7, wherein the at least one processor is further configured to:
determine a first attenuation level of signals in the determined frequency band of the second frequency band based on a third signal strength of the signals in the determined frequency band of the second frequency band detected by the at least one first detector;
tune the at least one first tunable filter to attenuate the signal strength of the signals in the determined frequency band of the second frequency band to the first attenuation level;
determine a second attenuation level of signals in the determined frequency band of the fourth frequency band based on a fourth signal strength of the signals in the determined frequency band of the fourth frequency band detected by the at least one second detector; and tune the at least one second tunable filter to attenuate the signal strength of the signals in the determined frequency band of the fourth frequency band to the second attenuation level.

9. The electronic device of claim 8, wherein the at least one processor is further configured to:

determine whether the determined frequency band of the second frequency band and the first attenuation level require additional tuning, by monitoring the signal strength of the signals in the determined frequency band of the second frequency band passing through the at least one first tunable filter using the at least one first detector; and determine whether the determined frequency band of the fourth frequency band and the second attenuation level require additional tuning, by monitoring the signal strength of the signals in the determined frequency band of the fourth frequency band passing through the at least one second tunable filter using the at least one second detector.

10. The electronic device of claim 7, wherein the at least one processor is further configured to:

tune the at least one first tunable filter to pass the signals in the portion of the second frequency band;

receive the first signal strength from the at least one first detector;

compare the received first signal strength to a predetermined first value;

when the received first signal strength is greater than the predetermined first value, determine a frequency band to be passed by the at least one first tunable filter in the portion of the second frequency band;

tune the at least one second tunable filter to pass the signals in the portion of the fourth frequency band;

receive the second signal strength from the at least one second detector;

compare the received second signal strength to a predetermined second value; and when the received second signal strength is greater than the predetermined second value, determine a frequency band to be passed by the at least one second tunable filter in the portion of the fourth frequency band.

11. The electronic device of claim 6, wherein the at least one processor is configured to adjust a gain of the PA.

12. The electronic device of claim 6, wherein the tunable RF circuit further comprises an embedded processor, and wherein the embedded processor is configured to:

determine at least one frequency band of the second frequency band to be passed by the at least one first tunable filter based on the first signal strength detected by the at least one first detector;

tune the at least one first tunable filter to pass the determined at least one frequency band of the second frequency band;

determine at least one frequency band of the fourth frequency band to be passed by the at least one second tunable filter based on the second signal strength detected by the at least one second detector; and tune the at least one second tunable filter to pass the determined at least one frequency band of the fourth frequency band.

13. A method for operating an electronic device, comprising:

detecting a signal strength of at least one frequency band passed by a tunable filter;

determining a frequency band to be passed by the tunable filter based on the detected signal strength of the at least one frequency band;

tuning the tunable filter to pass the determined frequency band;

determining an attenuation level of a signal in the determined frequency band to be attenuated by the tunable filter based on another signal strength of the signal in the determined frequency band; and tuning the tunable filter to attenuate the signal strength of the signal in the determined frequency band to the attenuation level.

14. The method of claim 13, further comprising:

adjusting strength of a transmit signal transmitted via an antenna based on the determined attenuation level.

15. The method of claim 14, further comprising:

after adjusting the strength of the transmit signal, re-detecting the signal strength of the signal in the determined frequency band attenuated by the tunable filter; and tuning the tunable filter to another attenuation level and attenuate the signal strength of the signal in the determined frequency band to the other attenuation level.

16. The method of claim 13, wherein the determining of the frequency band to be passed by the tunable filter based on the detected signal strength of the frequency band further comprises:

comparing the detected signal strength of the at least one frequency band with a predetermined value; and when the detected signal strength of the at least one frequency band is greater than the predetermined value, determining the frequency band to be passed by the tunable filter in the at least one frequency band.

17. The method of claim 16, further comprising:

monitoring another signal strength of a signal in the determined frequency band which passes the tunable filter; and based on a result of the monitoring, determining whether the determined frequency band and an attenuation level of the signal in the determined frequency band require additional tuning.

* * * * *